United States Patent
Doyle (10) Patent No.: US 8,570,807 B2
(45) Date of Patent: *Oct. 29, 2013

(54) NAND ARCHITECTURE MEMORY WITH VOLTAGE SENSING

(75) Inventor: Daniel Doyle, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/611,642

(22) Filed: Sep. 12, 2012

(65) Prior Publication Data

US 2013/0003458 A1    Jan. 3, 2013

Related U.S. Application Data

(60) Division of application No. 12/502,771, filed on Jul. 14, 2009, now Pat. No. 8,295,088, which is a continuation of application No. 11/518,785, filed on Sep. 11, 2006, now Pat. No. 7,561,472.

(51) Int. Cl.
| G11C 16/06 | (2006.01) |
| G11C 16/26 | (2006.01) |
| G11C 16/28 | (2006.01) |
| G11C 16/34 | (2006.01) |

(52) U.S. Cl.
USPC ............ 365/185.17; 365/185.03; 365/185.11; 365/185.18; 365/185.2; 365/185.21; 365/185.25; 365/185.22

(58) Field of Classification Search
USPC ............ 365/185.03, 185.11, 185.17, 185.18, 365/185.2, 185.21, 185.25, 185.22
See application file for complete search history.

(56) References Cited

U.S. PATENT DOCUMENTS

| 5,270,590 A | 12/1993 | Pascucci |
| 5,297,079 A | 3/1994 | Ha |
| 5,446,690 A | 8/1995 | Tanaka et al. |
| 5,521,864 A | 5/1996 | Kobayashi et al. |
| 5,901,086 A | 5/1999 | Wang et al. |
| 5,982,693 A | 11/1999 | Nguyen |
| 6,072,727 A | 6/2000 | La Rosa |
| 6,185,143 B1 | 2/2001 | Perner et al. |
| 6,438,038 B2 | 8/2002 | Ikehashi et al. |
| 6,449,201 B1 | 9/2002 | Kojima |
| 6,762,953 B2 | 7/2004 | Tanizaki et al. |
| 6,868,024 B2 | 3/2005 | Pekny |
| 6,946,882 B2 | 9/2005 | Gogl et al. |
| 6,950,341 B2 | 9/2005 | Takano et al. |
| 7,050,346 B2 | 5/2006 | Maejima et al. |
| 7,561,472 B2* | 7/2009 | Doyle ............... 365/185.17 |

(Continued)

*Primary Examiner* — J. H. Hur

(74) *Attorney, Agent, or Firm* — Leffert Jay & Polglaze, P.A.

(57) ABSTRACT

A NAND architecture non-volatile memory voltage sensing data read/verify process and sense amplifier has been described that senses data in floating gate or floating node field effect transistor memory cells using a voltage sensing data read/verify process. The voltage sensing process utilized a reference NAND string and reference memory cell that is coupled to a reference bit line. A voltage is precharged onto a bit line to be read and an associated reference bit line. The bit line is then coupled to a NAND string and selected memory cell while the reference bit line is coupled to a reference NAND string and selected reference memory cell. The relative voltage level of the bit line and reference bit line are then set by the relative currents flowing through the coupled NAND string and reference NAND string, and the voltage differential read by a coupled voltage sense amplifier.

20 Claims, 9 Drawing Sheets

(56) References Cited

U.S. PATENT DOCUMENTS

| | | | |
|---|---|---|---|
| 8,295,088 B2 * | 10/2012 | Doyle | 365/185.17 |
| 2003/0208663 A1 | 11/2003 | Van Buskirk et al. | |
| 2006/0209593 A1 | 9/2006 | Toda | |
| 2006/0239073 A1 | 10/2006 | Toda | |
| 2007/0019467 A1 | 1/2007 | Toda | |

* cited by examiner

NAND ARCHITECTURE MEMORY WITH VOLTAGE SENSING

RELATED APPLICATIONS

This application is a divisional of U.S. patent application Ser. No. 12/502,771, entitled, "NAND ARCHITECTURE MEMORY WITH VOLTAGE SENSING," filed on Jul. 14, 2009 (now U.S. Pat. No. 8,295,088), which is a continuation of U.S. patent application Ser. No. 11/518,785, entitled, "NAND ARCHITECTURE MEMORY WITH VOLTAGE SENSING," filed on Sep. 11, 2006 (now U.S. Pat. No. 7,561,472), which application is commonly assigned and incorporated in its entirety herein.

TECHNICAL FIELD

Embodiments of the present invention relate generally to memory devices and in particular the present invention relates to EEPROM and Flash memory devices.

BACKGROUND

Memory devices are conventionally provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Memory devices that do not lose the data content of their memory cells when power is removed are generally referred to as non-volatile memories. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the floating gate field effect transistor (FET) memory cells in the form of charge on the floating gates. The floating gate is typically made of doped polysilicon, or non-conductive charge trapping layer (a floating node), such as nitride, is disposed over the channel region and is electrically isolated from the other cell elements by a dielectric material, typically an oxide. Charge is transported to or removed from the floating gate or trapping layer by specialized programming and erase operations, respectively, altering the threshold voltage of the device.

Yet another type of non-volatile memory is a Flash memory. A typical Flash memory comprises a memory array, which includes a large number of floating gate memory cells. The cells are usually grouped into sections called "erase blocks." Each of the cells within an erase block can be electrically programmed by tunneling charges to its individual floating gate/node. Unlike programming operations, however, erase operations in Flash memories typically erase the memory cells in bulk erase operations, wherein all floating gate/node memory cells in a selected erase block are erased in a single operation. It is noted that in recent non-volatile memory devices multiple bits have been stored in a single cell by utilizing multiple threshold levels (multi-level cells or MLC) or a non-conductive charge trapping layer with the storing of data trapped in a charge near each of the sources/drains of the memory cell FET.

A NAND architecture array of a EEPROM or Flash also arranges its array of non-volatile memory cells in a matrix of rows and columns, as a conventional NOR array does, so that the gates of each non-volatile memory cell of the array are coupled by rows to word lines (WLs). However, unlike NOR, each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. It is noted that other non-volatile memory array architectures exist, including, but not limited to AND arrays, OR arrays, and virtual ground arrays.

A problem in non-volatile memory is that, while they can retain data in a non-volatile manner for significant periods of time once power is removed, their speed of operation for both read and write operations are typically significantly slower than that of volatile devices. This is particularly a problem in modern computer-based and battery powered portable devices, where non-volatile memory devices and NAND architecture Flash memory devices in particular, due to their low power consumption and high density of storage, are being asked to fill increasing roles at the same time as processor and memory bus speeds for these same devices are increasing. In addition, as device sizes and features are further reduced with improved processing, the operating current through a memory cell selected for read in the array is reduced. This reduced cell current can slow read and verify operations and cause difficulty sensing the data value/stored threshold voltage of a selected memory cell.

For the reasons stated above, and for other reasons stated below which will become apparent to those skilled in the art upon reading and understanding the present specification, there is a need in the art for alternative methods of reading and verifying NAND Flash memory arrays.

DETAILED DESCRIPTION

In the following detailed description of the present embodiments, reference is made to the accompanying drawings that form a part hereof, and in which is shown by way of illustration specific present embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the claims.

Embodiments of the present invention include non-volatile memory devices and arrays, and in particular NAND architecture non-volatile memory devices and arrays, that sense data in floating gate or floating node field effect transistor memory cells using a voltage sensing data read/verify process and sense amplifier. The voltage sensing process senses memory cells of a non-volatile memory array utilizing a voltage sense process and voltage sense amplifier that precharges a voltage onto a bit line to be read and a reference bit line coupled to a reference, such as a reference NAND string and memory cell. The bit line is then coupled to a NAND string and selected memory cell while the reference bit line is coupled to a reference NAND string and selected reference memory cell. The voltage level of the bit line and reference bit line are then set by the relative currents flowing through the coupled NAND string and reference NAND string, which is dependent on the threshold voltage of the programmed or erased state of their selected memory cells. The voltage differential between the bit line and reference bit line is then read by a coupled voltage sense amplifier. If the selected memory cell is erased, current flows through the memory cell to the source line and the bit line voltage falls relative to that of the reference bit line coupled to the reference cell. If the selected memory cell is programmed, little or no current flows through the cell, dependant on the programmed threshold voltage level of the cell and applied read select voltage on the gate of the memory cell, and the bit line voltage stays stable relative to the falling voltage of the reference bit line coupled to the reference cell, which is programmed at a known threshold voltage level. This allows utilization of fast sensing differential voltage sense amplifiers to sense data values and allow for fast NAND memory read and verify operation. In one embodiment, the reference NAND strings are in a paired bank that is associated with the bank being accessed. In another embodiment, the reference NAND strings are located at the far end of the bit lines within the associated bank to place them furthest from the centrally located sense amplifiers to provide a worst case bit line resistance and bit line RC. In yet another embodiment, the memory cells of the reference NAND strings are all programmed except for the final memory cell of the string that is being used as the reference memory cell. In a further embodiment, the memory cells of the reference NAND strings in a MLC NAND memory are all programmed except for the final memory cells of the string which are programmed in a step sequence to provide reference memory cells for each differing threshold voltage level/logic state from the erased state to the fully programmed state.

It is noted, while embodiments of the present invention are described in relation to NAND architecture non-volatile read and verify processes, that other memory array architectures, such as NOR architecture memory array and virtual ground memory array embodiments of the present invention, are also possible and will be apparent to those skilled in the art with the benefit of the present invention. It is also noted that embodiments of the present invention include all non-volatile memory cell devices and memories that use Vt to determine data values, such as, but not limited to, memory cells that trap charge in an electrically isolated regions, charge trapping/floating node memory cells and ferromagnetic memory cells, and thus are not limited to floating gate memory cell arrays or memory devices.

Figure 1:
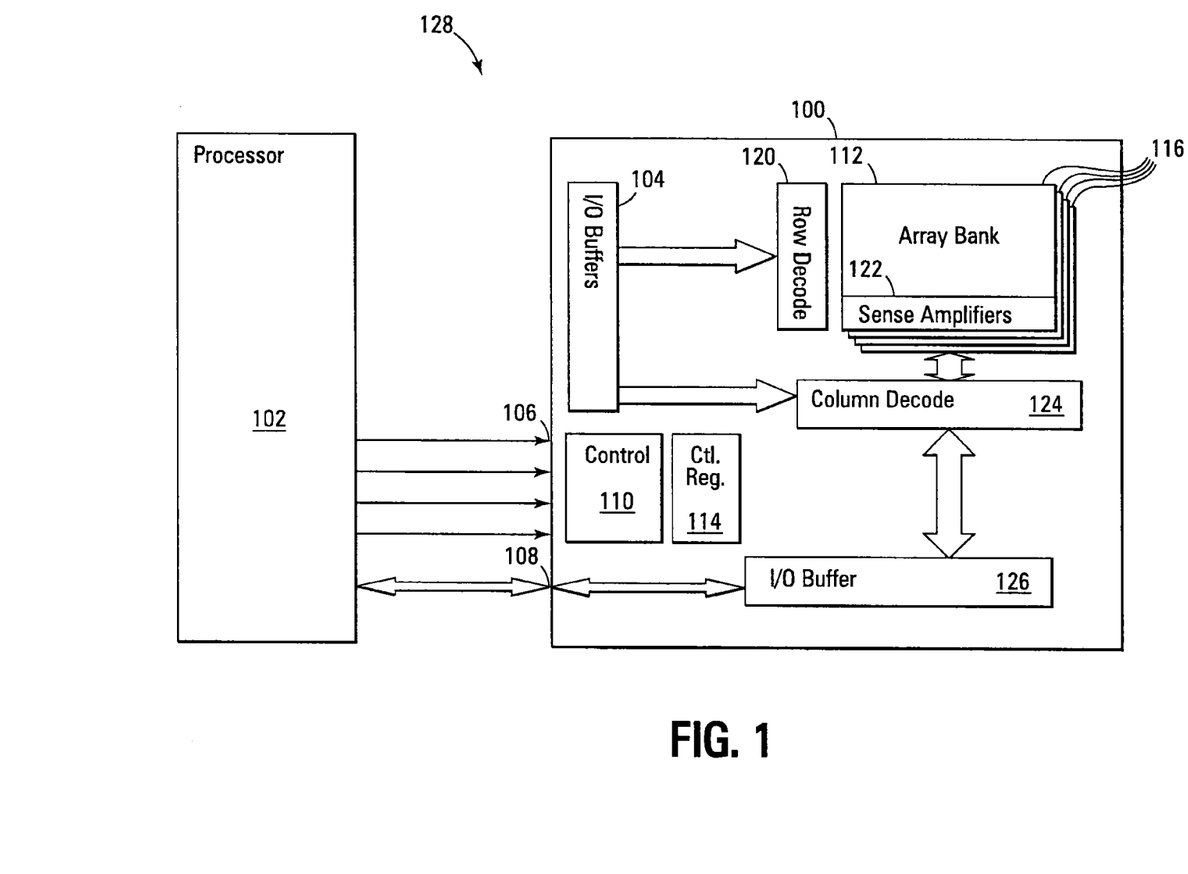
FIG. 1 is a simplified block diagram of a system containing a non-volatile memory device in accordance with an embodiment of the present invention.

FIG. 1 details a simplified diagram of a system 128 incorporating a non-volatile memory device 100 of an embodiment of the present invention connected to a host 102, which is typically a processing device or memory controller. The non-volatile memory 100, such as a Flash memory device, has a control interface 106 and an address/data interface 108 that are each connected to the processing device 102 to allow memory read and write accesses. It is noted that in other embodiments, the address/data interface 108 can be divided into separate interfaces. Internal to the non-volatile memory device a control state machine/control circuit 110 directs the internal operation; managing the non-volatile memory array 112 and updating RAM control registers and erase block management registers 114. The RAM control registers and tables 114 are utilized by the control state machine 110 during operation of the non-volatile memory 100. The non-volatile memory array 112 contains a sequence of memory banks or segments 116, each bank 116 is organized logically into a series of erase blocks (not shown). Memory access addresses are received on the address/data interface 108 of the non-volatile memory 100 and divided into a row and column address portions. On a read access, the row address is latched by the interface I/O buffer 104 and decoded by row decode circuit 120, which selects and activates a row page (not shown) of memory cells and the other memory cells in their associated strings across a selected memory bank. The bit values encoded in the output of the selected row of memory cells are connected from a local bit line/string (not shown) to a bit line (not shown) and detected by sense amplifiers 122 associated with the memory bank. The sense amplifiers 122 also typically include a data cache and write data latch circuits (not shown). The column address of the access is also latched by the interface I/O buffer 104 and decoded by the column decode circuit 124. The output of the column decode circuit selects the desired column data from the sense amplifier outputs and connected to the data buffer 126 for transfer from the memory device through the address/data interface 108. It is noted that in one embodiment of the present invention, the column decode 124 may be optionally placed between the memory array 112 and the sense amplifiers 122. On a write access the row decode circuit 120 selects the row page and column decode circuit selects write sense amplifiers 122. Data values to be written are connected from the data buffer 126 to the data cache and then to the write data latches of the write sense amplifiers 122 selected by the column decode circuit 124 and written to the selected non-volatile memory cells (not shown) of the memory array 112. The written cells are then reselected by the row and column decode circuits 120, 124 and sense amplifiers 122 (or optionally, separate verify sense amplifiers, not shown) so that they can be read to verify that the correct values have been programmed into the selected memory cells.

As stated above, two common types of non-volatile or Flash memory array architectures are the "NAND" and "NOR" architectures, so called for the resemblance which the basic memory cell configuration of each architecture has to a basic NAND or NOR gate circuit, respectively. In the NAND and NOR array architectures, the memory cells of the memory array are arranged in a matrix similar to conventional RAM or ROM, such that the gates of each memory cell of the array are coupled by rows to word lines (WL). However, in the NAND architecture array each memory cell is not directly coupled to a source line (SL) and a column bit line (BL), as would be the case in the NOR architecture style (a row and column matrix memory cells, each memory cell coupled between a source line and a bit line). Instead, in NAND, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity than the NOR array.

Figure 2:
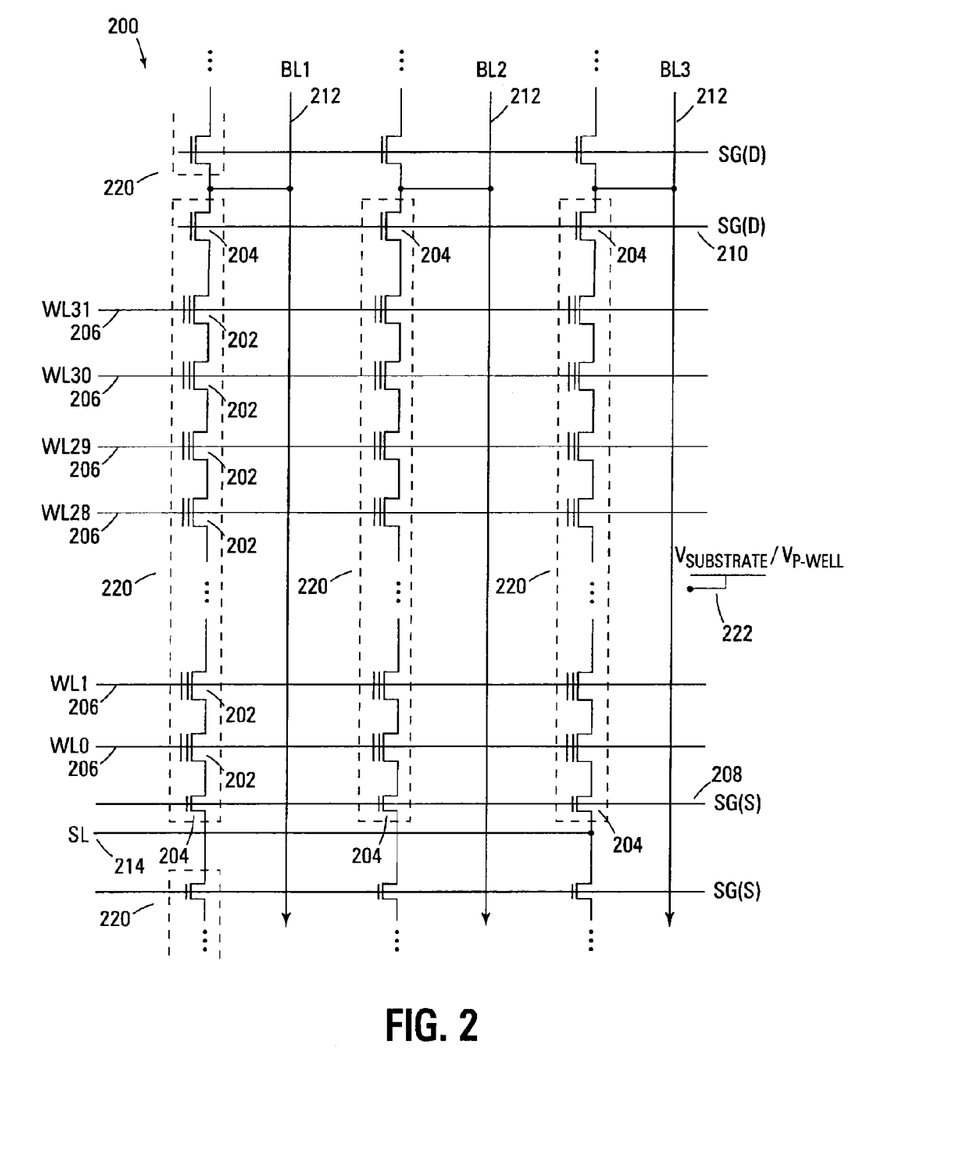
FIG. 2 is a simplified block diagram of a NAND architecture Flash memory array in accordance with an embodiment of the present invention.

FIG. 2 shows a schematic of a simplified NAND architecture floating node or trapping layer memory array 200 of a NAND Flash memory device of an embodiment of the present invention. It is noted that the memory array 200 of FIG. 2 is for illustrative purposes and should not be taken as limiting and that other NAND memory array embodiments of the present invention are possible and will be apparent to those skilled in the art with the benefit of the present disclosure. In FIG. 2, a series of NAND memory strings 220 are arranged in an array 200 and coupled to bit lines 212 and source lines 214. In each NAND memory string 220, a series of floating gate or floating node memory cells 202 of embodiments of the present invention are coupled together source to drain to form the NAND string 220 (typically having 8, 16, 32, or more cells). As described above, each floating gate/node memory cell FET 202 has a gate-insulator stack formed over the channel region. To further enable operation, in one embodiment of the present invention, one or more NAND architecture memory strings 220 of the memory are shown formed in an isolation trench, allowing the substrate of each isolation trench to be individually biased for programming and erasure. The word lines 206 couple across the NAND strings 220, coupling the control gates of adjacent memory cells 202 enabling a single memory cell 202 in each memory string 220 to be selected. In each NAND memory string 220, impurity (N+ typically) doped regions are formed between each gate insulator stack to form the source and drain regions of the adjacent memory cells 202, which additionally operate as connectors to couple the cells of the NAND string 220 together. In one embodiment of the present invention, the N+ doped regions are omitted and a single channel region is formed under the NAND memory string 220, coupling the individual memory cells 202. Each NAND memory string 220 is coupled to select gates 204 that are formed at either end of each NAND string 220 and selectively couple opposite ends of each NAND string 220 to a bit line 212 and a source line 214. The select gates 204 are each coupled to gate select lines, select gate drain {SG(D)} 210 and select gate source {SG(S)} 208, that control the coupling of the NAND strings to the bit lines 212 and source lines 214, respectively, through the select gates 204. In FIG. 2, the substrate connection 222 is shown coupled to each NAND string 220, allowing the memory cells 202 of each NAND string 220 to be biased from the substrate.

A NAND architecture floating gate or floating node memory array is accessed by a row decoder activating a row of memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each floating gate/node memory cell of the series coupled string, restricted only by the memory cells of each string that are selected to be read. This places the stored data values of the row of selected memory cells on the column bit lines. A column page of bit lines is selected and sensed, and then individual data words are selected from the sensed data words from the column page and communicated from the memory device.

Common programming technique for Flash/EEPROM memories programs a bit or row (commonly referred to as a page) of the memory by applying a programming voltage or series of programming voltage pulses to the control gates of the selected memory cells and then programming or inhibiting the selected memory cells to either programmed threshold level (typically to set at logical "0" by the injection of charge to the floating gate or floating node of a memory cell) or inhibited level (the cell is not programmed and left in its original state, usually intended to leave the cell erased and set at logical "1") by coupling the channels of the memory cells to either a program or inhibit voltage. It is noted that some erase operations also include program cycles. These erasure program cycles are typically used to preprogram the cells to a uniform programmed threshold voltage before erasure and to "heal" over-erased memory cells to a uniform erased state threshold voltage afterwards. It is noted that the above described programming operation is for illustrative purposes and should not be taken as limiting.

After programming the selected memory cell(s), a verify operation is then performed to confirm that the data was successfully programmed. If the programmed memory cell(s) fail verification, the program and verify cycle is repeated until the data is successfully programmed or a selected number of iterations have passed and the programming operation is deemed to have failed.

As stated above, common prior art current-based data value reading/sensing technique for Flash/EEPROM memories selects and activates a row page of memory cells across a selected memory bank of the array by applying a read voltage to their associated control gates and the application of a read pass voltage to the control gates of the unselected memory cells in the NAND strings. The bit values encoded in programmed or erased threshold voltage levels of the memory cells (typically, for a single level cell, set at logical "0" if programmed by the injection of charge to the floating gate or floating node of a memory cell, raising the threshold voltage of the cell required to make the cell conducting, or, if unprogrammed, left erased and set at logical "1") of the selected row are coupled to the bit lines through the current flowing through the selected NAND strings from the bit lines which is restricted by the threshold voltages of the selected memory cells. These relative current levels are then detected by the sense amplifiers to determine the programmed or erased threshold voltage data state of each of the selected memory cells.

In Prior art Flash/EEPROM memories, the sense amplifiers sense the current encoded bit values of the selected memory cell that are placed on the bit lines by either directly sensing current flow or by sensing in a single-ended manner a change in a pre-charged voltage level of the bit lines as they remain stable or are pulled down due to current flow through the selected memory cell after they are coupled together. In single-ended voltage sensing, each selected memory cell after it is coupled to the bit line either alters the pre-charged bit line voltage (if it allows current flow to its coupled source line, in other words, is unprogrammed) or does not alter the pre-charged bit line voltage (if it is programmed and its threshold voltage is such that it does not turn on when the control gate read voltage is applied). Multi-level memory cells (MLC's) are read similarly, although differing control gate read voltages are utilized to differentiate between the differing possible programmed threshold voltage states.

In direct current sensing or single ended voltage sensing, reading is a relatively slow process due to the amount of current flow or voltage swing required for effective sensing. This is particularly the case with sensing MLC memory cells and arrays with their closely spaced logic threshold windows. In addition, with decreasing feature sizes, operating voltage levels, and memory cell array pitch of modern non-volatile memory devices and arrays, these read speed issues are increasing in significance due to smaller current flows through memory cells, larger arrays, longer bit lines, higher bit line RC time constants, and smaller threshold voltage logic windows.

Volatile DRAM memory devices, while storing data in a fundamentally different manner (electrical charge stored in a capacitor) than non-volatile memories, have typically utilized double-ended differential voltage sensing processes to speed their read operations. In differential voltage sensing, the voltage level of the bit line coupled to the memory cell to be sensed is compared against the voltage level of a known reference. This allows for data values to be sensed quickly and with much smaller voltage swings, but require high quality voltage or logic state references to compare bit line voltages against. In addition, differential voltage sensing is relatively noise immune due to its inherent ability to reject common mode voltage noise and operate well in low supply voltage environments. However, differential voltage sensing has not been utilized in non-volatile memory, and in particular, NAND architecture non-volatile memory, due to fundamental technology differences, array sizes, numbers of sense amplifiers utilized, and the difficulty in providing an accurate reference to compare against.

Embodiments of the present invention include NAND architecture non-volatile memory devices and arrays that sense data in floating gate or floating node field effect transistor memory cells using a differential voltage sensing data read/verify process and sense amplifier. The differential voltage sensing process senses memory cells of a non-volatile memory array utilizing a voltage sense process and voltage sense amplifiers that precharges a precharge voltage onto a bit line to be read and also onto a reference bit line. The bit line is then coupled to a NAND string and selected memory cell while the reference bit line is coupled to a reference NAND string and selected reference memory cell. The voltage levels of the bit line and reference bit line are then set by the relative currents flowing through their coupled NAND strings. The voltage differential between the bit line and reference bit line is then read by a coupled differential voltage sense amplifier. If the selected memory cell is erased, current flows through the memory cell to the source line and the bit line voltage falls relative to that of the reference bit line coupled to the reference cell. If the selected memory cell is programmed, little or no current flows through the cell, dependant on the programmed threshold voltage level of the cell and applied read select voltage on the gate of the memory cell, and the bit line voltage stays stable relative to the falling voltage of the reference bit line coupled to the reference cell, which is programmed at a known threshold voltage level. This allows utilization of fast DRAM-style differential voltage sense amplifiers to sense data values for fast NAND memory read and verify operation.

As stated above, a difficulty in utilizing differential voltage sensing and voltage sense amplifiers in non-volatile memory devices is in providing an appropriate reference to compare the voltage of the selected bit line and memory cell against, for without an accurate and stable voltage reference, differential sensing is difficult to do and can be inaccurate. This providing of an accurate reference to allow for differential voltage sensing is particularly a problem in NAND architecture memory arrays and devices due to the structure of the NAND string and memory manufacturing process variability. As such, the best voltage references are based on the architecture and memory cell technology itself to provide as accurate a reference as possible and one that also accounts for manufacturing process variations.

The NAND architecture memory embodiments of the present invention therefore provide reference NAND strings to compare against that are based on the same manufacturing process as the selected NAND strings being sensed. To provide an accurate reference as possible, in one embodiment, the reference NAND strings are programmed and placed in the NAND array in such a manner as to provide a reference that represents a worst case sensing scenario in program state and bit line and string resistance and RC time constant. In addition, in another embodiment, the word line read and read pass voltages the reference string are selected lower to provide a worse case reference string or to adjust sensing margins for different sensing operations (read, erase verify, or program verify). In yet another embodiment, program states of the memory cells of the reference string are selected to provide a worse case reference.

Figure 3A:
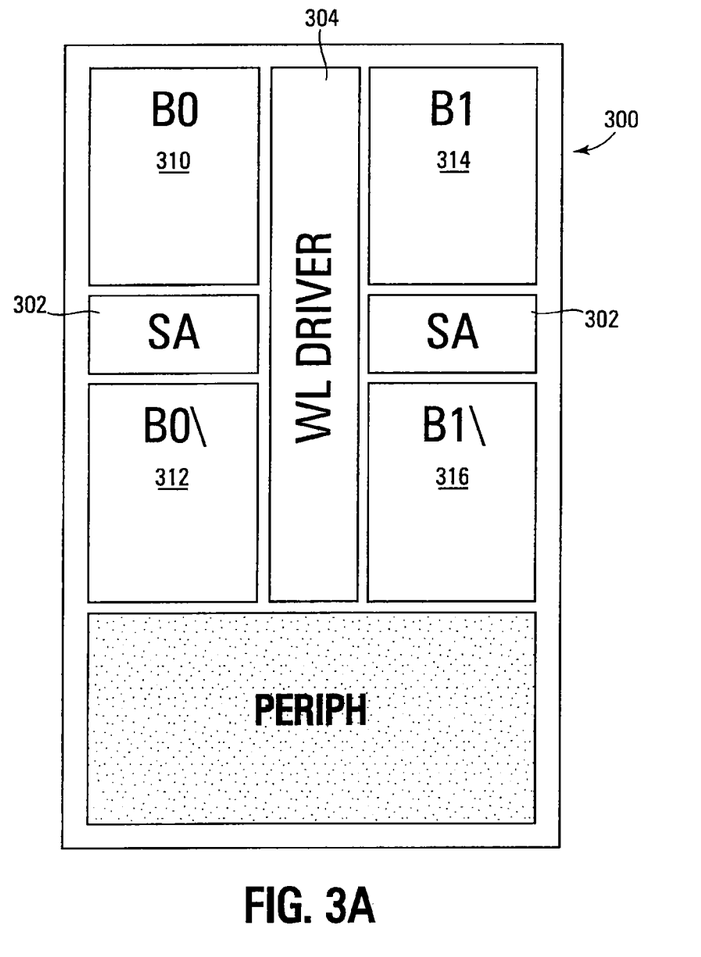
FIGS. 3A and 3B show diagrams detailing NAND arrays and voltage sense amplifiers in accordance with embodiments of the present invention.

FIG. 3A details a NAND architecture memory array 300 of an embodiment of the present invention. In FIG. 3A, the array has a sequence of 4 array banks 310, 312, 314, and 316 that are paired together for sensing purposes with bank B0 310 being paired with Bank B0\ 312, and Bank B1 314 being paired with bank B1\ 316. Located between each paired set of banks is a centrally located differential voltage sense amplifier circuit 302. A final erase block or set of strings of each bank 310, 312, 314, 316 is reserved to function as reference strings. During a sensing operation, bit lines coupled to the selected NAND strings in the selected bank are precharged to a selected precharge voltage. In addition, bit lines in the associated bank of the bank pair (i.e. bank B0\ if bank B0 is selected, bank B0 for bank B0\, bank B1\ for bank B1, and bank B1 for bank B1\) are also precharged to the precharge voltage level. A row of memory cells are then selected in the selected bank by the row decoders and their coupled word lines driven by the word line drivers 304. In addition, the unselected word lines of the selected NAND strings are also driven by read pass voltages and the selected NAND strings coupled through the bit lines to the sense amplifiers 302. The word line drivers 304 also select and drive the word lines coupled to the reserved reference NAND strings in the associated bank of the bank pair (i.e. bank B0\ if bank B0 is selected, bank B0 for bank B0\, bank B1\ for bank B1, and bank B1 for bank B1\) and couple the reference NAND strings to the bit lines of the associated bank to provide voltage references on reference bit lines to the sense amplifiers 302. The data values stored in the selected memory cells of the selected NAND strings are then sensed by comparing the voltage difference between the bit lines from the selected bank and the reference bit lines coupled to the reference NAND strings from the associated bank.

Figure 3B:
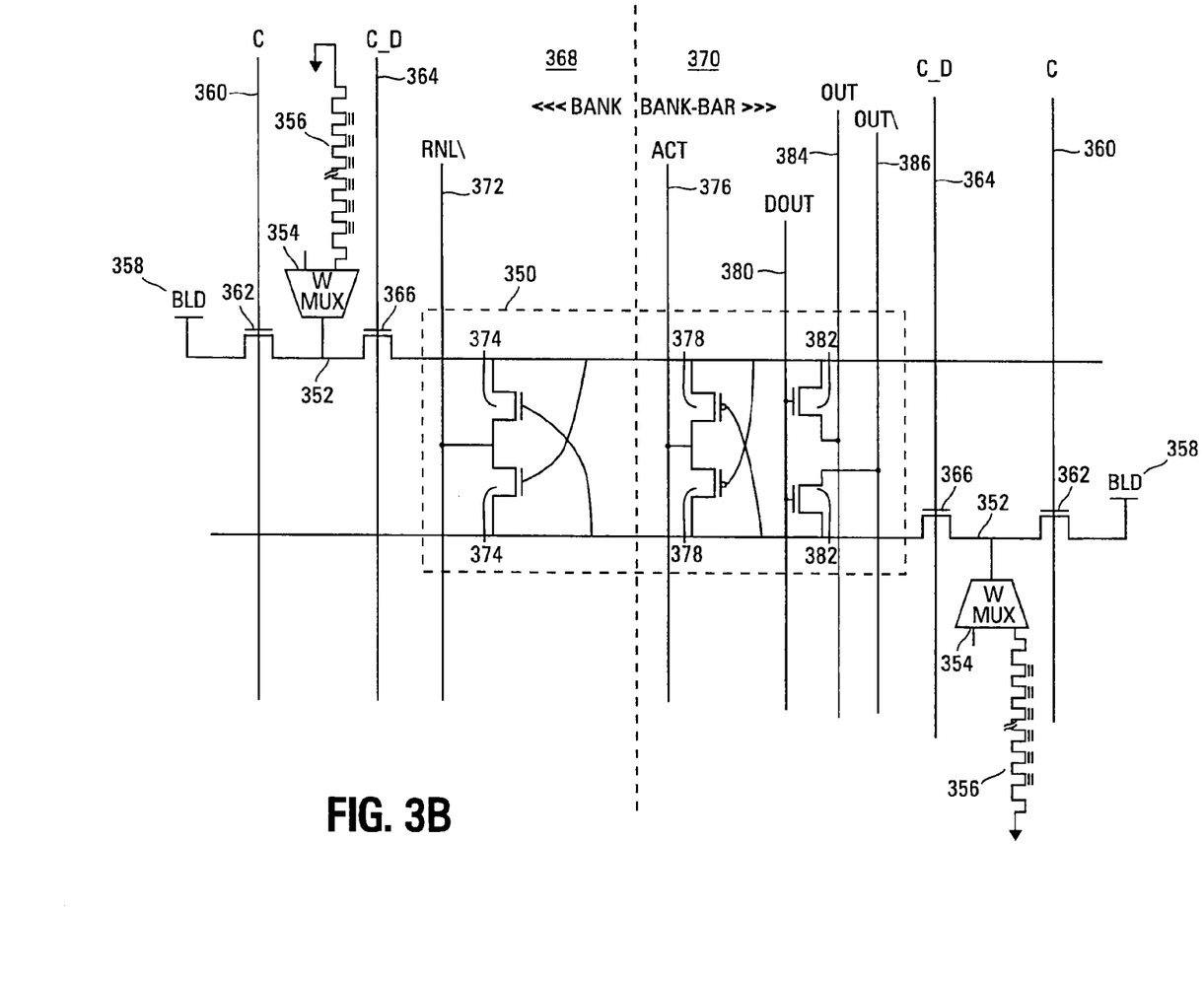

FIG. 3B details a voltage sense amplifier 350 of one embodiment of the present invention and associated array circuitry. In FIG. 3B, the sense amplifier 350 is coupled between a bank pair (BANK 368 and BANK BAR 370). In each bank 368, 370, the selected NAND string 356 that is to be read and the reference NAND string 356 are coupled to bit lines 352 through a "W" MUX 354, that allows for increased array density by allowing 2 bit lines on successive "pages" to share the same sense amplifier and word lines. It is noted that in other array embodiments of the present invention, the NAND strings 356 are coupled directly to the bit lines 352 without the use of W MUXs 354. During a sensing operation, both the selected and reference bit lines 352 are first coupled to a precharge voltage, BLD 358, through pass gate transistors 362 under control of precharge signal "C" 360. It is noted that in one embodiment, the precharge voltage is an intermediate voltage, such as 0.9V, while in another the precharge voltage is Vcc (to take advantage of the greater voltage differential afforded and the faster bit line voltage change due to the higher start bit line voltage and exponential discharge rate through the NAND strings). It is noted that in various embodiments of the present invention the precharge voltage is selected from between 0.5*Vcc and 1.5*Vcc. After precharging the bit lines 352, precharge signal "C" turns off, isolating the bit lines 352 from the precharge voltage source BLD 358. The bit lines 352 are then coupled after a delay period to the sense amplifier 350 through pass transistors 366 under control of the delayed precharge signal "C_d" 364 to be sensed.

The sense amplifier 350 contains cross coupled transistor pairs 374 and 378 that, along with the signals RNL\ 372 and ACT 376, are utilized to sense the relative voltage differential, and thus the data value of the selected memory cell, of the coupled bit lines 352. As the bit lines 352 are coupled to the sense amplifier 350 by the action of signal C_d 364, signals RNL\ 372 and ACT 376 become active. The active low signal RNL\ 372 is coupled to the center node of series coupled N-FET transistors 374, that are coupled between the two incoming bit lines 352. The control gate of the lower N-FET transistor 374 is coupled to the upper incoming bit line 352 and the control gate of the upper N-FET transistor 374 is coupled to the lower incoming bit line 352. The active high signal ACT 376 is coupled to the center node of series coupled P-FET transistors 378, that are also coupled between the two incoming bit lines 352. The control gate of the lower P-FET transistor 378 is coupled to the upper incoming bit line 352 and the control gate of the upper P-FET transistor 378 is coupled to the lower incoming bit line 352. Upon a voltage differential developing on the coupled bit lines that is indicative of the stored data value, the feedback of the cross coupled N-FET transistors 374 and active low signal RNL\ 372 drive the lower voltage bit line 352 further down, while the feedback of the cross coupled P-FET transistors 378 and active high signal ACT 376 drive the higher voltage bit line 352 further up to lock in the sensed data value. Once the data value has been sensed by the sense amplifier 350, it is read out of the sense amplifier 350 by the activation of the DOUT signal 380, that couples the read data value state to the signal lines OUT 384 and OUT\ 386 through pass transistors 382.

Figure 4A:
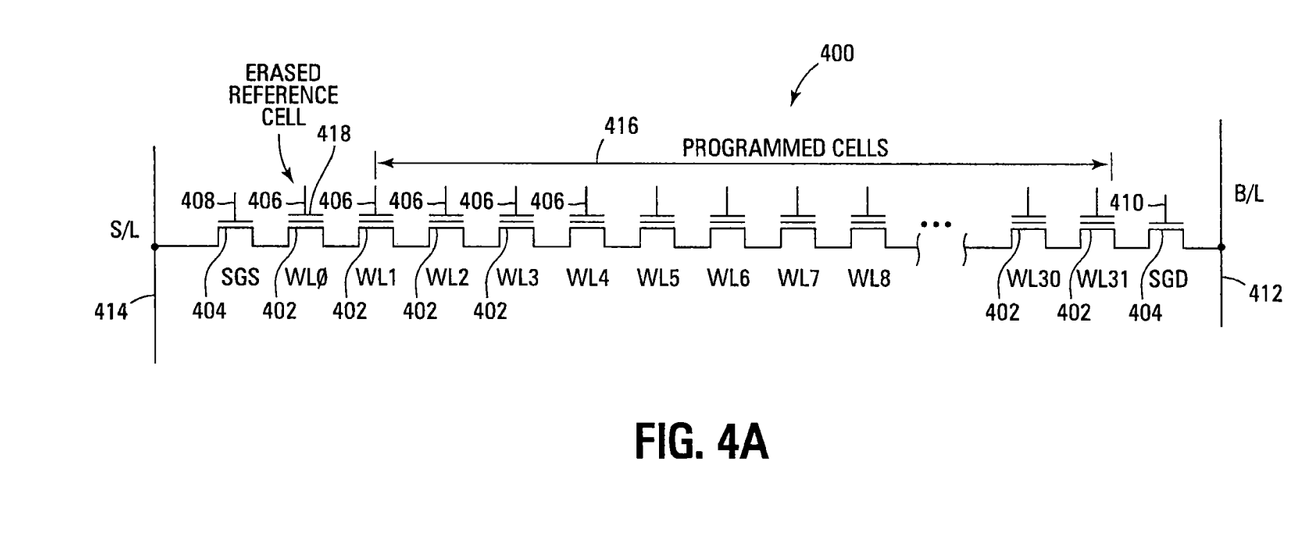
FIGS. 4A and 4B show diagrams detailing NAND reference strings in accordance with embodiments of the present invention.
Figure 4B:
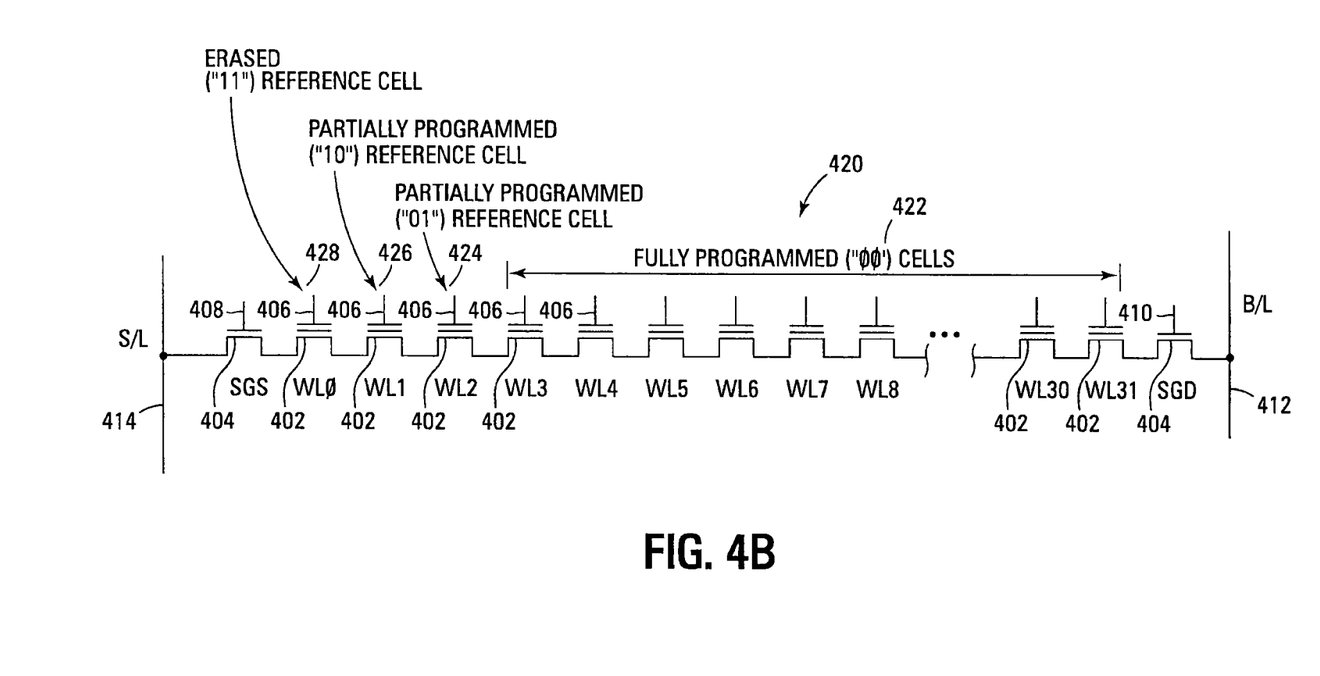

FIGS. 4A and 4B detail reference NAND strings 400, 420 of embodiments of the present invention. As stated above, a difficulty in utilizing differential voltage sensing and voltage sense amplifiers in non-volatile memory devices is in providing an appropriate reference to compare the voltage of the selected bit line and memory cell against, for without an accurate and stable voltage reference, differential sensing is difficult to do and can be inaccurate. This providing of an accurate reference to allow for differential voltage sensing is particularly a problem in NAND architecture memory arrays and devices due to the structure of the NAND string and memory manufacturing process variability. In particular, in NAND architecture non-volatile memory devices any such reference must match or be larger than any normal string reading an erased or "1" data value from a selected memory cell and yet still pass as much current as possible. In addition, in NAND architecture memory, and in many other non-volatile memory array architectures, the word lines typically traverses the entire bank or plane of the memory array being accessed. Thus, the reference string cannot be from the same bank, as would be the case in a DRAM voltage sensing operation. String resistance is also typically high due to the high resistance presented by the unselected cells of the selected string (31 unselected cells of a typical 32 cell string), which is further increased by the program state of the memory cells of the string, with all unselected cells being fully programmed (logical "0" in single level cells, SLC) being the worse case. The total worse case internal string resistance is thus much higher than that of a selected memory cell storing an erased "1" state. The perceived NAND string resistance also varies with the location of the string on the bit line and with the location of the selected memory cell in the string and the programmed or erased states of the cells that are upstream or downstream from it in the string. Thus the signal to noise ratio of the memory cell bit being measured relative to the total resistance and total resistance variation is small, preventing any "live" string that actively stores other data from being used as a reference. In addition, any reference should work well over supply voltage and temperature variations and track well with the NAND string and selected cell being measured. As such "dummy" reference resistances will not work well and the best voltage references will based on the architecture and memory cell technology itself to provide as accurate a reference as possible and one that also accounts for manufacturing process variations. Embodiments of the present invention overcome these NAND string reference limitations by pairing memory banks and selecting dedicated reference NAND strings from a dedicated final row or final erase block contained in the paired bank associated with the bank selected for reading. These reference NAND strings are also programmed to maximize string resistance and placed at or near the end of their respective bit lines. In one embodiment the word line voltages of the unselected memory cells of the reference NAND strings are also adjusted to a lower read pass voltage (such as Vread_pass−Vth) to further increase resistance. This modification in read pass voltage for the reference NAND strings from that of the selected NAND strings further increases read margin and ensures proper discrimination between a "1" state and a "0" state stored in the read memory cells. In addition, these reference NAND string word line voltages can be modified during differing memory operations, such as during and erase verify operation, a program verify operation, or a read operation. In particular, in situations where a separate verify sense amplifier is not provided in the memory device or array to allow for a dedicated sense amplifier with proper sensing margins of the memory cell state for the specific operation being performed.

FIG. 4A details a single level cell (SLC) NAND reference string 400 of an embodiment of the present invention. In FIG. 4A, a reference NAND string 400 contains a plurality of series coupled floating gate or floating node SLC memory cells 402. The reference NAND string 400 is coupled to a bit line 412 through a drain select gate 404 controlled by a drain select control line 410 and is coupled to a source line 414 through a source select gate 404 and coupled source select control line 408. The memory cells 402 of the reference NAND string are all in a programmed threshold state 416, except for a final memory cell 418 that is in an erased threshold state. During a read operation the final memory cell 418 is the selected memory cell of the string driven at the read select voltage level and the unselected "programmed" memory cells 416 are driven at the read pass voltage level or the selected reference read pass voltage level.

FIG. 4B details a multi-level cell (MLC) NAND reference string 420 of an embodiment of the present invention. In FIG. 4B, a reference NAND string 420 contains a plurality of series coupled floating gate or floating node MLC memory cells 402. The reference NAND string 420 is coupled to a bit line 412 through a drain select gate 404 controlled by a drain select control line 410 and is coupled to a source line 414 through a source select gate 404 and coupled source select control line 408. The memory cells 402 of the reference NAND string are all in a programmed threshold state 422 (logical state 00), except for a final sequence of memory cells 424, 426, 428 (for logical states 11, 10 and 01) that are in an intermediate or erased threshold state. During a read operation the final memory cells 424, 426, 428 are sequentially utilized as the selected memory cell of the string to determine the matching threshold value of the memory cell being sensed. As above, the selected memory cell 424, 426, 428 is driven at the read select voltage level and the unselected "programmed" memory cells 422 and remaining unselected final memory cells 424, 426, 428 are driven at the read pass voltage level or the selected reference read pass voltage level.

It is noted that in embodiments of the present invention that utilize W-MUXs to couple multiple bit lines to sense amplifiers on differing "pages" utilizing the same active word lines, only a portion (such as half in one embodiment) of the final erase block (if in block based non-volatile memory device) need be reserved for utilization as reference strings. However, it is also noted that, while the remaining strings of the final erase block are not required to be reserved as reference strings, they also cannot be erased without affecting the reference strings and their programmed threshold voltages. It is noted that in one embodiment, these reference string threshold voltages are factory programmed during the manufacturing process or set in reference to an internal master reference. Therefore, in one embodiment of the present invention, these remaining NAND strings that have not been utilized as reference NAND strings are used to store overhead data or management data of the memory device that will not need to be erased.

Figure 5A:
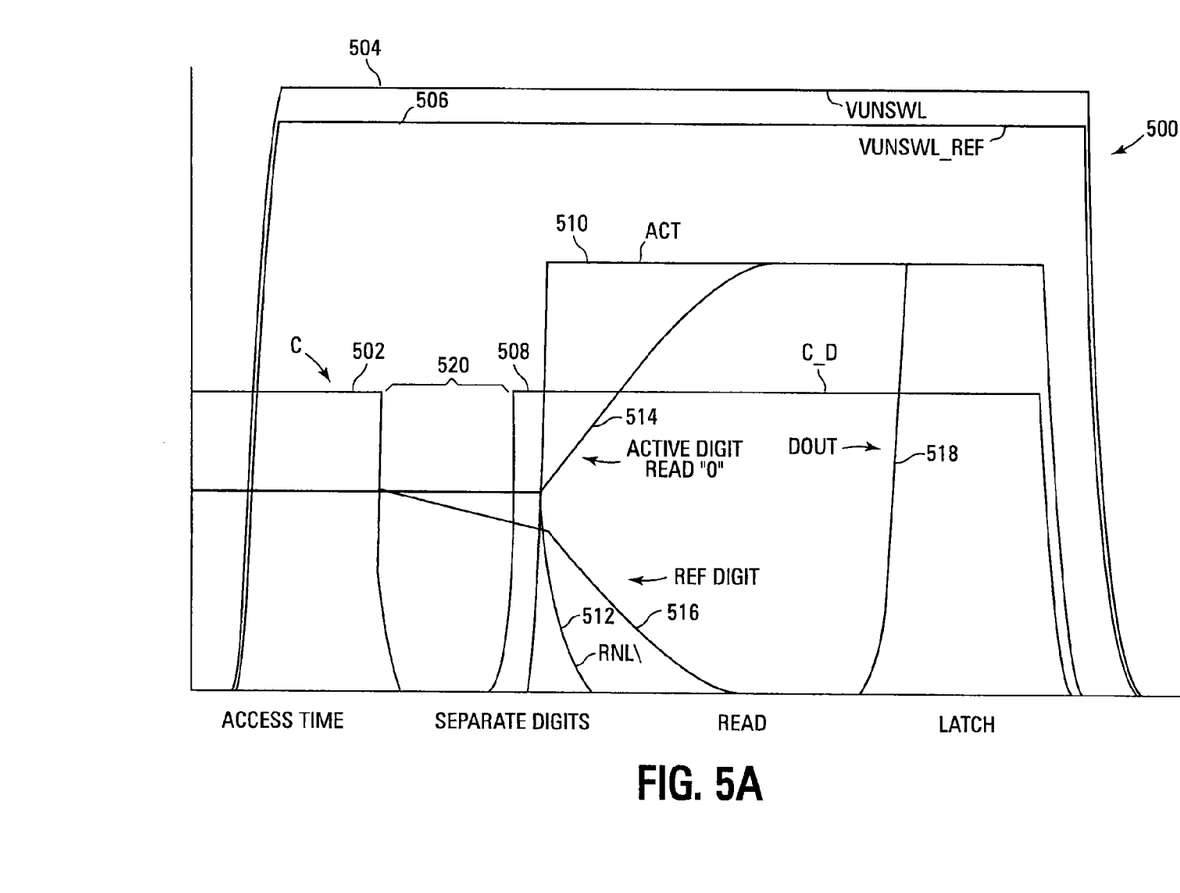
FIGS. 5A and 5B show diagrams detailing NAND array voltage sensing waveforms in accordance with embodiments of the present invention.

FIG. 5A illustrates waveforms 500 of an embodiment of a memory 300 of the present invention showing a memory cell of the array storing a "0" data value being read/sensed. In FIG. 5A, the bit lines 352 coupled to a non-volatile NAND string and memory cell 302 that has been selected to be read/sensed and its paired reference NAND string are precharged by the assertion of signal line "C" 502. At the same time, the word lines of the unselected memory cells of the selected NAND string and reference NAND string are driven by read pass voltage (VUNSWL) 504 and reference read pass voltage (VUNSWL_REF) 506. It is noted that, in one embodiment, the reference read pass voltage (VUNSWL_REF) 506 is selected to be VUNSWL_REF=VUNSWL−Vth during a read operation, VUNSWL_REF=VUNSWL during a program verify operation, and VUNSWL_REF=VUNSWL+Vth during an erase verify operation to ensure adequate read margin for "1" and "0" threshold states. After a delay time period 520, the bit lines 352 are coupled to the sense amplifier 350 by the active signal "C_d" 508 and the active low signal RNL\ 512 and active high signal ACT 510 asserted to begin the sensing process. As the memory cell of the selected NAND string being read stores a programmed "0" threshold value, little or no current flows through it and the selected NAND string to the source line. This leaves the coupled bit line 352 relatively stable and high compared to the decreasing voltage of the reference bit line that is flowing current (at a relatively slow rate) through the unprogrammed reference cell of the high resistance reference NAND string to its coupled source line. The feedback path of the sense amplifier senses this relative voltage differential of the coupled bit lines and forces the bit line coupled to the selected NAND string high 514 and the bit line coupled to the reference NAND string low 516. Once the data value has been sensed and latched, it is read out of the sense amplifier by activation of the DOUT signal 518 to end the read operation.

Figure 5B:
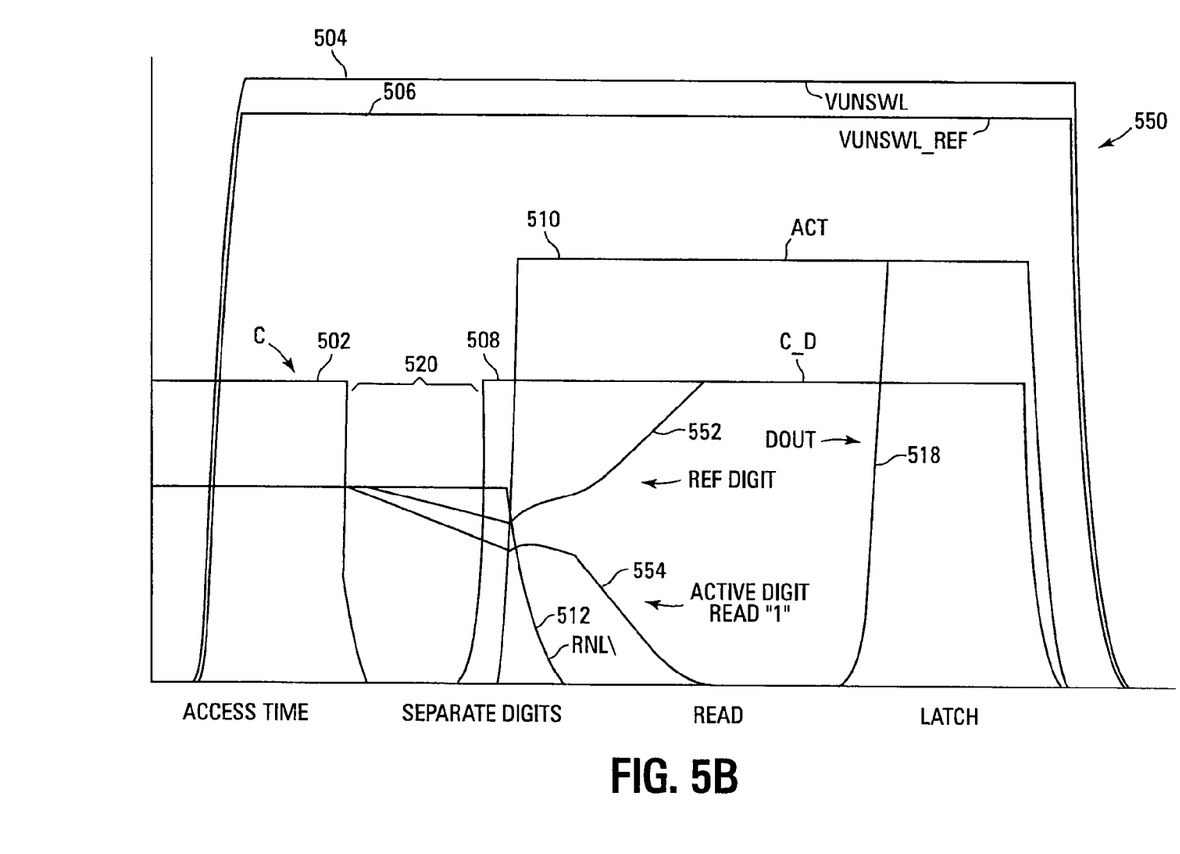

FIG. 5B illustrates waveforms 550 of an embodiment of a memory 300 of the present invention showing a memory cell of the array storing a "1" data value being read/sensed. In FIG. 5B, the bit lines 352 coupled to a non-volatile NAND string and memory cell 302 that has been selected to be read/sensed and its paired reference NAND string are precharged by the assertion of signal line "C" 502. At the same time, the word lines of the unselected memory cells of the selected NAND string and reference NAND string are driven by read pass voltage (VUNSWL) 504 and reference read pass voltage (VUNSWL_REF) 506. After a delay time period 520, the bit lines 352 are coupled to the sense amplifier 350 by the active signal "C_d" 508 and the active low signal RNL\ 512 and active high signal ACT 510 asserted to begin the sensing process. As the memory cell of the selected NAND string being read stores an erased "1" threshold value, current flows through it and the selected NAND string to the source line. This lowers the precharged voltage of the coupled bit line 352 so that it is relatively lower compared to the decreasing voltage of the reference bit line that is flowing current (at a relatively slow rate) through the unprogrammed reference cell of the high resistance reference NAND string to its coupled source line. The feedback path of the sense amplifier senses this relative voltage differential of the coupled bit lines and forces the bit line coupled to the selected NAND string lower 554 and the bit line coupled to the reference NAND string high 552. Once the data value has been sensed and latched, it is read out of the sense amplifier by activation of the DOUT signal 518 to end the read operation.

It is noted that the NAND array circuitry, sense amplifiers, reference strings, and NAND read/sensing operations described in FIGS. 3A, 3B, 4A, 4B, 5A and 5B are for illustrative purposes and should not be taken as limiting. In particular, it is noted that differing voltage sense amplifiers with differing designs and characteristics are known in the art and may be utilized in embodiments of the present invention. It is also noted that while embodiments of the present invention in FIGS. 3A, 3B, 4A, 4B, 5A and 5B are described in relation to NAND architecture non-volatile read and verify processes, that other memory array architectures that include differential voltage sense amplifiers coupled to reference memory cells/reference memory cell structures that are placed in separate memory array banks from the memory array banks holding the selected memory cells/selected memory cell units, such as NOR architecture memory array and virtual ground memory array embodiments of the present invention, are also possible and will be apparent to those skilled in the art with the benefit of the present invention.

Figure 6:
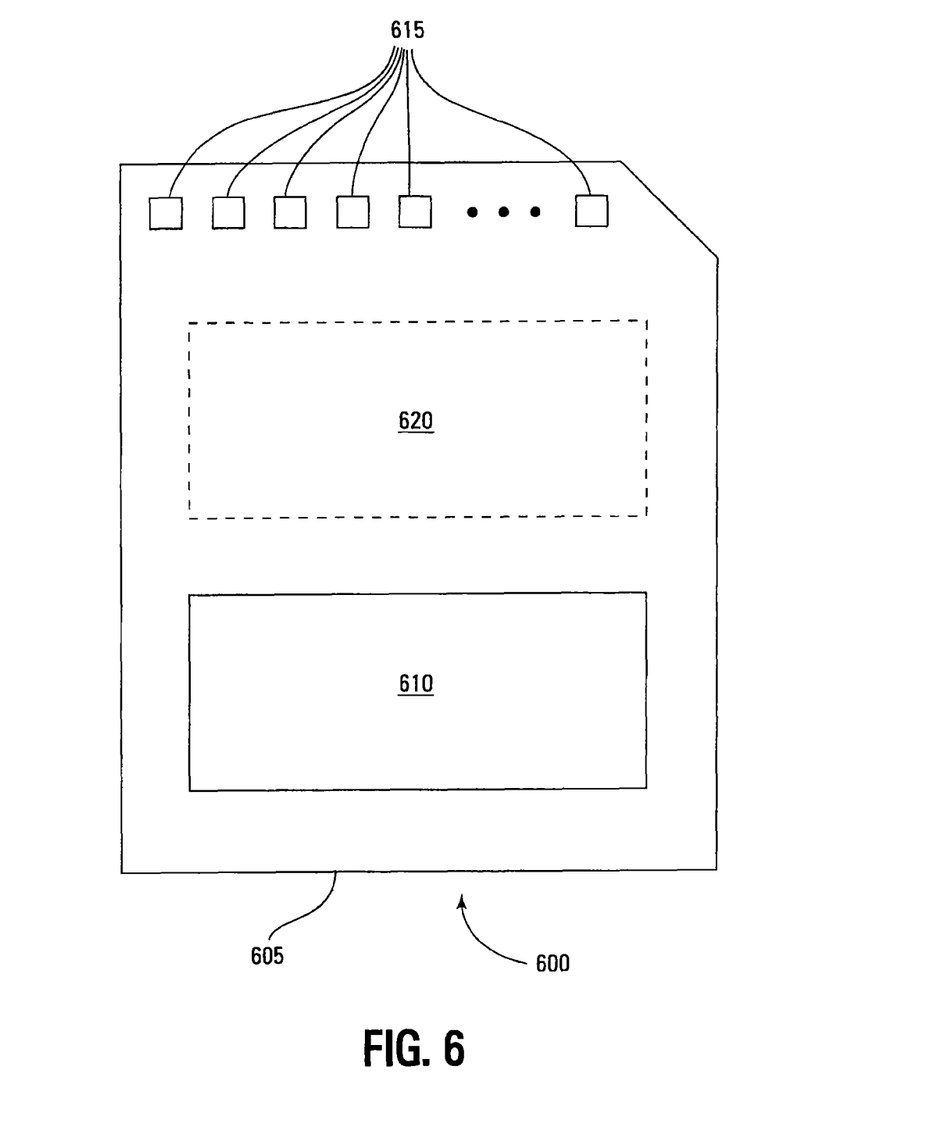
FIG. 6 is a simplified block diagram of a memory module in accordance with an embodiment of the present invention.

FIG. 6 is an illustration of a memory module 600 in accordance with an embodiment of the present invention. Memory module 600 is illustrated as a memory card, although the concepts discussed with reference to memory module 600 are applicable to other types of removable or portable memory, e.g., USB flash drives, and are intended to be within the scope of "memory module" as used herein. In addition, although one example form factor is depicted in FIG. 6, these concepts are applicable to other form factors as well.

In some embodiments, memory module 600 will include a housing 605 (as depicted) to enclose one or more memory devices 610, though such a housing is not essential to all devices or device applications. At least one memory device 610 is a non-volatile memory including circuits of or adapted to perform elements of methods of the present invention. Where present, the housing 605 includes one or more contacts 615 for communication with a host device. Examples of host devices include digital cameras, digital recording and playback devices, PDAs, personal computers, memory card readers, interface hubs and the like. For some embodiments, the contacts 615 are in the form of a standardized interface. For example, with a USB flash drive, the contacts 615 might be in the form of a USB Type-A male connector. In general, however, contacts 615 provide an interface for passing control, address and/or data signals between the memory module 600 and a host having compatible receptors for the contacts 615.

The memory module 600 may optionally include additional circuitry 620 which may be one or more integrated circuits and/or discrete components. For some embodiments, the additional circuitry 620 may include a memory controller for controlling access across multiple memory devices 610 and/or for providing a translation layer between an external host and a memory device 610. For example, there may not be a one-to-one correspondence between the number of contacts 615 and a number of I/O connections to the one or more memory devices 610. Thus, a memory controller could selectively couple an I/O connection (not shown in FIG. 6) of a memory device 610 to receive the appropriate signal at the appropriate I/O connection at the appropriate time or to provide the appropriate signal at the appropriate contact 615 at the appropriate time. Similarly, the communication protocol between a host and the memory module 600 may be different than what is required for access of a memory device 610. A memory controller could then translate the command sequences received from a host into the appropriate command sequences to achieve the desired access to the memory device 610. Such translation may further include changes in signal voltage levels in addition to command sequences.

The additional circuitry 620 may further include functionality unrelated to control of a memory device 610 such as logic functions as might be performed by an ASIC (application specific integrated circuit). Also, the additional circuitry 620 may include circuitry to restrict read or write access to the memory module 600, such as password protection, biometrics or the like. The additional circuitry 620 may include circuitry to indicate a status of the memory module 600. For example, the additional circuitry 620 may include functionality to determine whether power is being supplied to the memory module 600 and whether the memory module 600 is currently being accessed, and to display an indication of its status, such as a solid light while powered and a flashing light while being accessed. The additional circuitry 620 may further include passive devices, such as decoupling capacitors to help regulate power requirements within the memory module 600.

It is noted that other voltage sensing read/verify operations, sense amplifiers, non-volatile memory array architectures, and voltage levels for non-volatile memory device and array embodiments of the present invention are possible and will be apparent for those skilled in the art with the benefit of this disclosure.

CONCLUSION

A NAND architecture non-volatile memory voltage sensing data read/verify process and sense amplifier has been described that senses data in floating gate or floating node field effect transistor memory cells using a voltage sensing data read/verify process. The voltage sensing process utilized a specialized reference NAND string and reference memory cell that is coupled to a reference bit line. A voltage is precharged onto a bit line to be read and the reference bit line. The bit line is then coupled to a NAND string and selected memory cell, while the reference bit line is coupled to a reference NAND string and reference memory cell. The relative voltage level of the bit line and reference bit line are then set by the relative currents flowing through the coupled NAND string and reference NAND string, and the voltage differential read by a coupled voltage sense amplifier. In one embodiment, the reference NAND strings are located at the far end of the bit lines from the centrally located sense amplifiers in a paired bank of the memory array from the NAND strings being read to provide a worst case bit line resistance and bit line RC. In another embodiment, the memory cells of the reference NAND strings are all programmed except for the final one or more memory cells of the string that are being used as reference memory cells.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating a NAND architecture non-volatile memory device, comprising:
   placing a precharge voltage on one or more first bit lines and one or more second bit lines;
   coupling the one or more first bit lines to one or more selected NAND strings, wherein one or more control gates of one or more unselected memory cells of each selected NAND string are driven by a read pass voltage, and where a control gate of a selected memory cell is driven by a read voltage;
   coupling the one or more second bit lines to one or more reference NAND strings, wherein one or more control gates of one or more unselected memory cells of each reference NAND string are driven by a read pass voltage, and where a control gate of a reference memory cell is driven by a read voltage; and
   sensing the difference between a voltage level of each of the one or more first bit lines and a voltage level of each of the one or more second bit lines to determine a threshold voltage level of the selected non-volatile memory cells of each selected NAND string;
   wherein the NAND architecture non-volatile memory device is a single level cell (SLC) memory device and where the one or more unselected memory cells of each of the one or more reference NAND strings are programmed and the reference memory cell of each of the one or more reference NAND strings is erased.

2. The method of claim 1, wherein the one or more first bit lines are from a first array bank and the one or more second bit lines are from a second array bank.

3. The method of claim 2, wherein the one or more reference NAND strings are contained in a last erase block of the second array bank.

4. The method of claim 1, further comprising:
wherein the read pass voltage driving the one or more control gates of one or more unselected memory cells of each selected NAND string is greater than the read pass voltage driving the one or more control gates of one or more unselected memory cells of each reference NAND string during a read operation;
wherein the read pass voltage driving the one or more control gates of one or more unselected memory cells of each selected NAND string is equal to the read pass voltage driving the one or more control gates of one or more unselected memory cells of each reference NAND string during a program verify operation; and
wherein the read pass voltage driving the one or more control gates of one or more unselected memory cells of each selected NAND string is less than the read pass voltage driving the one or more control gates of one or more unselected memory cells of each reference NAND string during an erase verify operation.

5. A method of operating a NAND architecture non-volatile memory device, comprising:
placing a precharge voltage on one or more first bit lines and one or more second bit lines;
coupling the one or more first bit lines to one or more selected NAND strings, wherein one or more control gates of one or more unselected memory cells of each selected NAND string are driven by a read pass voltage, and where a control gate of a selected memory cell is driven by a read voltage;
coupling the one or more second bit lines to one or more reference NAND strings, wherein one or more control gates of one or more unselected memory cells of each reference NAND string are driven by a read pass voltage, and where a control gate of a reference memory cell is driven by a read voltage; and
sensing the difference between a voltage level of each of the one or more first bit lines and a voltage level of each of the one or more second bit lines to determine a threshold voltage level of the selected non-volatile memory cells of each selected NAND string;
wherein the NAND architecture non-volatile memory device is a multi-level cell (MLC) memory device and where the one or more unselected memory cells of each of the one or more reference NAND strings are programmed, one or more reference memory cells of each of the one or more reference NAND strings are partially programmed, and a reference memory cell of each of the one or more reference NAND strings is erased.

6. The method of claim 5, wherein coupling the one or more first bit lines to one or more selected NAND strings and coupling the one or more second bit lines to one or more reference NAND strings comprises coupling the one or more first bit lines to one or more selected NAND strings and coupling the one or more second bit lines to one or more reference NAND strings wherein the one or more first bit lines and the one or more second bit lines are from different array banks.

7. The method of claim 5, wherein coupling the one or more second bit lines to one or more reference NAND strings comprises coupling the one or more second bit lines to one or more reference NAND strings contained in a last erase block of the array bank having the one or more second bit lines.

8. The method of claim 5, wherein the read pass voltage driving the one or more control gates of one or more unselected memory cells of each selected NAND string is different than the read pass voltage driving the one or more control gates of one or more unselected memory cells of each reference NAND string.

9. The method of claim 8, wherein the read pass voltage driving the one or more control gates of one or more unselected memory cells of each selected NAND string is greater than the read pass voltage driving the one or more control gates of one or more unselected memory cells of each reference NAND string.

10. A method of sensing a data value in a memory cell of a non-volatile NAND architecture memory string, comprising:
applying a precharge voltage to a selected bit line and a reference bit line;
applying a read voltage to a selected word line coupled to a selected non-volatile memory cell of the NAND architecture memory string that is selected for reading;
applying a pass voltage to one or more unselected word lines and coupled non-volatile memory cells of the non-volatile NAND architecture memory string;
coupling the non-volatile NAND architecture memory string to a source line and the bit line;
applying a read voltage to a selected word line coupled to a selected reference memory cell of a reference non-volatile NAND architecture memory string;
applying a pass voltage to one or more unselected word lines and coupled non-volatile memory cells of the reference non-volatile NAND architecture memory string;
coupling the reference non-volatile NAND architecture memory string to a source line and the reference bit line; and
sensing a voltage difference between the bit line and the reference bit line to determine a data value stored in the selected non-volatile memory cell of the non-volatile NAND architecture memory string;
wherein the non-volatile NAND architecture memory string is a single level cell (SLC) memory string and where the one or more unselected memory cells of the reference NAND string are programmed and the reference memory cell is erased.

11. The method of claim 10, coupling the non-volatile NAND architecture memory string to a source line and the bit line and coupling the reference non-volatile NAND architecture memory string to a source line and the reference bit line comprises coupling the non-volatile NAND architecture memory string to a bit line in a first array bank and coupling the reference non-volatile NAND architecture memory string to a bit line in a second array bank.

12. A method of sensing a data value in a memory cell of a non-volatile NAND architecture memory string, comprising:
applying a precharge voltage to a selected bit line and a reference bit line;
applying a read voltage to a selected word line coupled to a selected non-volatile memory cell of the NAND architecture memory string that is selected for reading;
applying a pass voltage to one or more unselected word lines and coupled non-volatile memory cells of the non-volatile NAND architecture memory string;
coupling the non-volatile NAND architecture memory string to a source line and the bit line;
applying a read voltage to a selected word line coupled to a selected reference memory cell of a reference non-volatile NAND architecture memory string;

applying a pass voltage to one or more unselected word lines and coupled non-volatile memory cells of the reference non-volatile NAND architecture memory string;

coupling the reference non-volatile NAND architecture memory string to a source line and the reference bit line; and sensing a voltage difference between the bit line and the reference bit line to determine a data value stored in the selected non-volatile memory cell of the non-volatile NAND architecture memory string;

wherein the non-volatile NAND architecture memory string is a multi-level cell (MLC) memory string and where the one or more unselected memory cells of the reference NAND string are programmed, one or more reference memory cells of the reference NAND string are partially programmed, and a reference memory cell of the reference NAND string is erased.

13. The method of claim 12, wherein coupling the non-volatile NAND architecture memory string to a source line and the bit line comprises coupling the non-volatile NAND architecture memory string to a bit line in a different array bank than the reference bit line.

14. The method of claim 12, wherein the pass voltage applied to one or more unselected word lines of the non-volatile NAND architecture memory string is different than the pass voltage applied to one or more unselected word lines of the reference non-volatile NAND architecture memory string.

15. The method of claim 14, wherein the pass voltage applied to one or more unselected word lines of the non-volatile NAND architecture memory string is greater than the pass voltage applied to one or more unselected word lines of the reference non-volatile NAND architecture memory string for a read operation of the selected non-volatile memory cell and less than the pass voltage applied to one or more unselected word lines of the reference non-volatile NAND architecture memory string for an erase verify operation of the selected non-volatile memory cell.

16. A non-volatile NAND architecture memory device, comprising:
 a NAND architecture non-volatile memory array having a plurality of memory blocks;
 a differential voltage sense amplifier circuit coupled to the array; and
 a control circuit, wherein the control circuit and differential voltage sense amplifier circuit are adapted to read memory cells in a selected memory block of the non-volatile memory array by,
  placing a precharge voltage on one or more first bit lines and one or more second bit lines,
  coupling the one or more first bit lines to one or more selected NAND strings, wherein one or more control gates of one or more unselected memory cells of each selected NAND string are driven by a read pass voltage, and where a control gate of a selected memory cell is driven by a read voltage,
  coupling the one or more second bit lines to one or more reference NAND strings, wherein one or more control gates of one or more unselected memory cells of each reference NAND string are driven by a read pass voltage, and where a control gate of a reference memory cell is driven by a read voltage, and
  sensing the difference between a voltage level of each of the one or more first bit lines and a voltage level of each of the one or more second bit lines to determine a threshold voltage level of the selected non-volatile memory cells of each selected NAND string;
 wherein the non-volatile NAND architecture memory device is a single level cell (SLC) memory device and where the one or more unselected memory cells of each reference NAND string are programmed and the reference memory cell is erased.

17. The non-volatile NAND architecture memory device of claim 16, wherein the one or more first bit lines are from a first array bank and the one or more second bit lines are from a second array bank.

18. A non-volatile NAND architecture memory device, comprising:
 a NAND architecture non-volatile memory array having a plurality of memory blocks;
 a differential voltage sense amplifier circuit coupled to the array; and
 a control circuit, wherein the control circuit and differential voltage sense amplifier circuit are adapted to read memory cells in a selected memory block of the non-volatile memory array by,
  placing a precharge voltage on one or more first bit lines and one or more second bit lines,
  coupling the one or more first bit lines to one or more selected NAND strings, wherein one or more control gates of one or more unselected memory cells of each selected NAND string are driven by a read pass voltage, and where a control gate of a selected memory cell is driven by a read voltage,
  coupling the one or more second bit lines to one or more reference NAND strings, wherein one or more control gates of one or more unselected memory cells of each reference NAND string are driven by a read pass voltage, and where a control gate of a reference memory cell is driven by a read voltage, and
  sensing the difference between a voltage level of each of the one or more first bit lines and a voltage level of each of the one or more second bit lines to determine a threshold voltage level of the selected non-volatile memory cells of each selected NAND string;
 wherein the non-volatile NAND architecture memory device is a multi-level cell (MLC) memory device and where the one or more unselected memory cells of each reference NAND string are programmed, one or more reference memory cells of each reference NAND string are partially programmed, and a reference memory cell of each reference NAND string is erased.

19. The non-volatile NAND architecture memory device of claim 18, wherein the one or more first bit lines are from a different array bank than the one or more second bit lines.

20. The non-volatile NAND architecture memory device of claim 18, wherein the control circuit is adapted to select a read pass voltage for the one or more control gates of one or more unselected memory cells of each reference NAND string that is greater than the read pass voltage for the one or more control gates of one or more unselected memory cells of each selected NAND string during an erase verify operation of the NAND architecture memory device and to select a read pass voltage for the one or more control gates of one or more unselected memory cells of each reference NAND string that is less than the read pass voltage for the one or more control gates of one or more unselected memory cells of each selected NAND string during a read operation of the NAND architecture memory device.

* * * * *